United States Patent
Lim

(10) Patent No.: US 8,415,689 B2
(45) Date of Patent: Apr. 9, 2013

(54) SEMICONDUCTOR LIGHT EMITTING DEVICE

(75) Inventor: Woo Sik Lim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 303 days.

(21) Appl. No.: 12/432,207

(22) Filed: Apr. 29, 2009

(65) Prior Publication Data

US 2009/0272994 A1 Nov. 5, 2009

(30) Foreign Application Priority Data

Apr. 30, 2008 (KR) .................. 10-2008-0040747

(51) Int. Cl.
*H01L 29/205* (2006.01)
*H01L 33/00* (2010.01)

(52) U.S. Cl.
USPC .................. 257/91; 257/E33.065

(58) Field of Classification Search .......... 257/79, 257/E33.065, 91
See application file for complete search history.

(56) References Cited

U.S. PATENT DOCUMENTS

| 6,784,462 B2 * | 8/2004 | Schubert ............. 257/98 |
| 2002/0000558 A1 * | 1/2002 | Morimoto ............. 257/79 |
| 2004/0195579 A1 * | 10/2004 | Sonobe ............. 257/99 |
| 2005/0104081 A1 | 5/2005 | Kim et al. |
| 2006/0049411 A1 * | 3/2006 | Nakamura et al. ........ 257/79 |
| 2006/0180819 A1 | 8/2006 | Kim et al. |
| 2007/0215882 A1 * | 9/2007 | Son ............. 257/79 |

FOREIGN PATENT DOCUMENTS

| KR | 10-2005-0013042 A | 2/2005 |
| KR | 10-0601992 B1 | 7/2006 |
| KR | 10-2007-0118064 A | 12/2007 |

\* cited by examiner

*Primary Examiner* — Daniel Luke
(74) *Attorney, Agent, or Firm* — Birch, Stewart, Kolasch & Birch, LLP

(57) ABSTRACT

The embodiment discloses a semiconductor light emitting device. The semiconductor light emitting device comprises a first conductive semiconductor layer, an active layer on the first conductive semiconductor layer, a second conductive semiconductor layer on the active layer, a first electrode formed under the first conductive semiconductor layer and comprising a patterns of a predetermined shape, and a nitride semiconductor layer between the patterns of the first electrode.

18 Claims, 11 Drawing Sheets

SEMICONDUCTOR LIGHT EMITTING DEVICE

The present application claims priority under 35 U.S.C. 365 to Korean Patent Application No. 10-2008-0040747 (filed on Apr. 30, 2008), which is hereby incorporated by reference in its entirety.

BACKGROUND

The embodiment relates to a semiconductor light emitting device.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors comprise a semiconductor material having a compositional formula of $In_x Al_y Ga_{1-x-y} N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a semiconductor light emitting device comprising a first electrode under a first conductive semiconductor layer.

The embodiment provides a semiconductor light emitting device comprising a first electrode branching into at least one branch under a first conductive semiconductor layer.

The embodiment provides a semiconductor light emitting device comprising a first electrode in a nitride semiconductor layer under a first conductive semiconductor layer.

The embodiment provides a semiconductor light emitting device comprising a first electrode, which is formed between a first conductive semiconductor layer and a substrate in a predetermined pattern, and a first electrode pad connected to a part of the first electrode.

An embodiment provides a semiconductor light emitting device comprising: a first conductive semiconductor layer; an active layer on the first conductive semiconductor layer; a second conductive semiconductor layer on the active layer; a first electrode under the first conductive semiconductor layer, the first electrode comprising a patterns having a predetermined shape; and a nitride semiconductor layer between the patterns of the first electrode.

An embodiment provides a semiconductor light emitting device comprising: a first conductive semiconductor layer; a first electrode under the first conductive semiconductor layer, the first electrode comprising a pattern having a predetermined shape; a nitride semiconductor layer under the first electrode; an active layer on the first conductive semiconductor layer; a second conductive semiconductor layer on the active layer; and a second electrode unit on the second conductive semiconductor layer.

An embodiment provides a semiconductor light emitting device comprising: a light emitting structure comprising a plurality of compound semiconductor layers; a first electrode branching into at least one branch under the light emitting structure; a nitride semiconductor layer among branches of the first electrode; a first electrode pad electrically connected to the first electrode; and a second electrode unit on the light emitting structure.

DETAILED DESCRIPTION OF THE EMBODIMENTS

Figure 1:
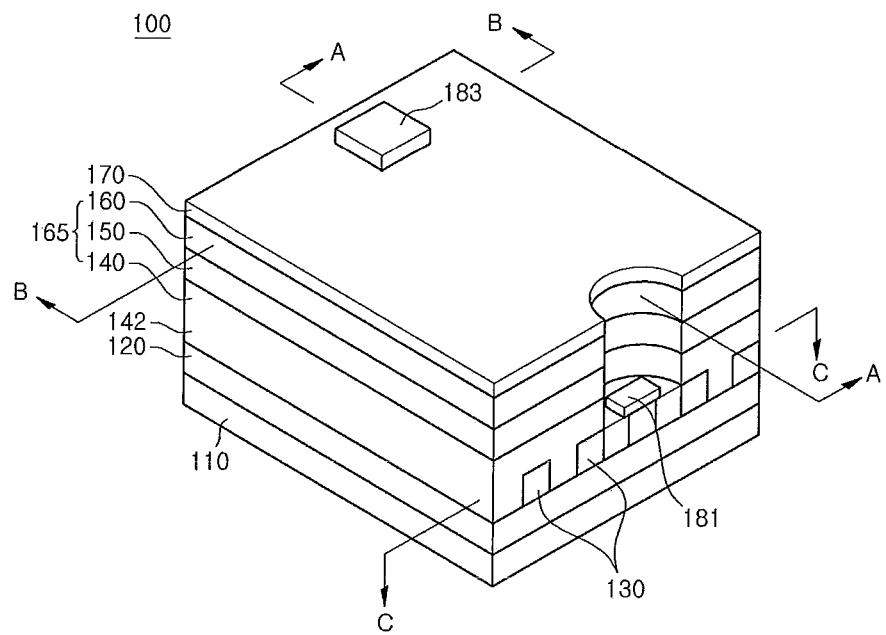
FIG. 1 is a perspective view showing a semiconductor light emitting device according to the first embodiment.

Hereinafter, the embodiments will be described with reference to the accompanying drawings. In the description of the embodiments, the term "on" or "under" of each layer will be described with reference to the accompanying drawings and thickness of each layer is not limited to thickness shown in the drawings.

Figure 2:
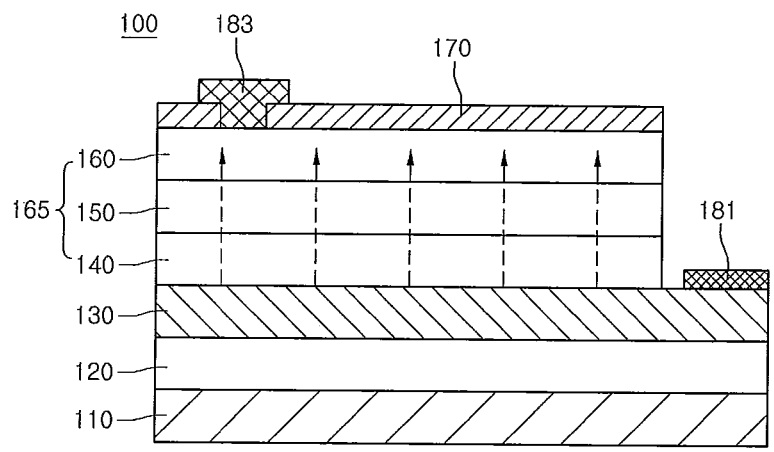
FIG. 2 is a side sectional view taken along line A-A of FIG. 1.
Figure 3:
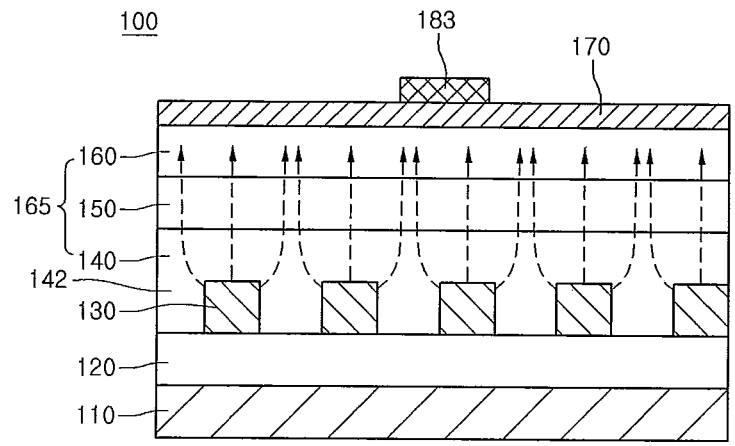
FIG. 3 is a side sectional view taken along line B-B of FIG. 1.
Figure 4:
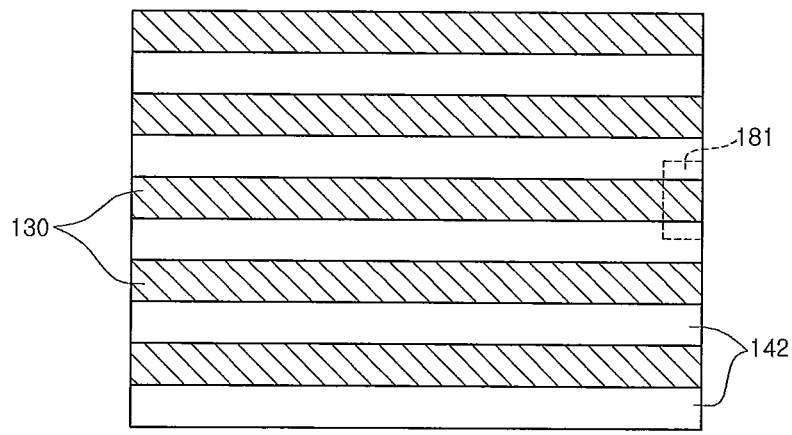
FIG. 4 is a side sectional view taken along line C-C of FIG. 1.

FIG. 1 is a perspective view showing a semiconductor light emitting device according to the first embodiment, FIG. 2 is a side sectional view taken along line A-A of FIG. 1, FIG. 3 is a side sectional view taken along line B-B of FIG. 1, and FIG. 4 is a side sectional view taken along line C-C of FIG. 1.

Referring to FIG. 1, the semiconductor light emitting device 100 comprises a substrate 110, a nitride semiconductor layer 120, a first electrode 130, a first conductive semiconductor layer 140, an active layer 150, a second conductive semiconductor layer 160, a second electrode layer 170, a first electrode pad 181 and a second electrode pad 183.

The substrate 110 may comprise one selected from the group consisting of sapphire ($Al_2O_3$), SiC, Si, GaAs, GaN, ZnO, GaP, InP, and Ge. A concave-convex pattern can be formed on and/or under the substrate 110. The concave-convex pattern may have one of a stripe shape, a lens shape, a column shape, and a conical shape.

The nitride semiconductor layer 120 is formed on the substrate 110. The nitride semiconductor layer 120 may have a single layer structure or a multi-layer structure. For instance, the nitride semiconductor layer 120 may comprise a buffer layer (not shown) and/or an undoped semiconductor layer (not shown). The buffer layer relieves a lattice mismatching between GaN material and substrate material, and comprises at least one selected from the group consisting of GaN, InN, AlN, InGaN, AlGaN, InAlGaN and AlInN. The undoped semiconductor layer can be formed on the substrate 110 or the buffer layer, and may comprise an undoped GaN-based semiconductor. In addition, if the nitride semiconductor layer 120 has the multi-layer structure, a group III-V compound semiconductor layer is formed at the upper portion of the multi-layer structure, but the embodiment is not limited thereto. The nitride semiconductor layer 120 has a predetermined thickness, for instance, 140 Å to 1000 Å.

The first electrode 130 and the first conductive semiconductor layer 140 are formed on the nitride semiconductor layer 120.

The first electrode 130 formed on the nitride semiconductor layer 120 may comprise conductive material. In addition, the first electrode 130 may comprise reflective electrode material or transmissive electrode material, but the embodiment is not limited thereto.

For instance, the first electrode 130 may selectively employ metallic material, oxide material or nitride material comprising metal. The metal used for the first electrode 130 has a work function of 3 eV or above.

The first electrode 130 may comprise at least one selected from the group consisting of Ag, Al, Au, Bi, C, Ca, Cd, Cu, Fe, Hi, Hg, Ir, La, Mo, Nd, Ni, Pb, Pt, Ta, Ti, Th, W, Zn, and Zr and may have a single layer structure or a multi-layer structure.

The first electrode pad 181 is locally formed on a pattern of the first electrode 130. The first electrode pad 181 may comprise material identical to that of the first electrode 130, but the embodiment is not limited thereto.

At least one first electrode pad 181 can be provided in a single chip corresponding to the chip size. The first electrode pad 181 is formed on the first electrode 130 and the first conductive semiconductor layer 140 and is electrically connected thereto.

The first electrode 130 and the first electrode pad 181 constitute a first electrode unit that supplies power to the first conductive semiconductor layer 140.

Referring to FIGS. 1 to 4, the first electrode 130 is formed in the form of a pattern having at least one branch. For instance, the first electrode 130 can be formed in the form of a stripe pattern having a predetermined interval. A part of the first electrode 130 may serve as the first electrode pad 181. In this case, the first electrode pad 181 can be omitted.

If a plurality of first electrodes 130 are formed in the form of the strip patterns having a predetermined interval, an additional electrode pattern can be provided to connect the first electrodes 130 one another. For instance, the first electrode pad 181 can be formed after forming the additional electrode pattern that connects the first electrodes 130 one another. The additional electrode pattern can be formed on the first electrodes 140 by mesa-etching one side of the chip or can be formed in the process of forming the first electrodes 140.

The first electrodes 130 may have various pattern shapes, such as a linear pattern, at least one curve pattern, a linear-curve pattern, a branch pattern branching from one pattern, a polygonal pattern, a lattice pattern, a dot pattern, a lozenge pattern, a parallelogrammic pattern, a mesh pattern, a stripe pattern, a cross pattern, a radial pattern, a circular pattern, and a mixed pattern thereof. However, the shape and the number of the patterns may be variously embodied in the embodiment without limitation. These pattern shapes will be described later in more detail.

The first electrode 130 can uniformly supply power from the bottom of the first conductive semiconductor layer 140, so that current may not be concentrated on one spot.

The first electrode pad 181 is provided at a predetermined position such that power can be smoothly supplied through the first electrode 130. For instance, the first electrode pad 181 is positioned at a center portion or an edge portion of the first electrode 130 prepared in the form of a pattern.

Referring to FIGS. 1 and 3, the first conductive semiconductor layer 140 is formed on the first electrode 130 and the nitride semiconductor layer 120. The first conductive semiconductor layer 140 may have a single-layer structure or a multi-layer structure.

A lower portion 142 of the first conductive semiconductor layer 140 is arranged corresponding to gaps among the first electrodes 130 formed on the nitride semiconductor layer 120.

The first conductive semiconductor layer 140 comprises semiconductor material doped with first conductive dopant and makes contact with the first electrode 130. If the first conductive semiconductor layer 140 is an N-type semiconductor layer, the first conductive semiconductor layer 140 may comprise at least one of GaN, InN, AlN, InGaN, AlGaN, InAlGaN and AlInN and the first conductive dopant may selectively comprise N-type dopant, such as Si, Ge, Sn or Te.

The lower portion 142 of the first conductive semiconductor layer 140 may be formed an undoped semiconductor layer and/or a buffer layer, or other semiconductor material, but the embodiment is not limited thereto.

The first electrode 130 is positioned under the first conductive semiconductor layer 140 in order to uniformly supply power having first polarity. An undoped semiconductor layer can be formed between the first electrode 130 and the first conductive semiconductor layer 140. The undoped semiconductor layer has a thin thickness (for example, 5 μm or less) in such a manner that the undoped semiconductor layer may not serve as resistance.

The active layer 150 is formed on the first conductive semiconductor layer 140. The active layer 150 is configured to have a single quantum well structure or a multiple quantum well (MQW) structure by using groups III-V compound semiconductor materials. For instance, the active layer 150 has a structure comprising InGaN well/GaN barrier layers. The active layer 150 comprises material having a band gap energy corresponding to the wavelength of light emitted through the active layer 150. For instance, the active layer 150 selectively comprises material that emits color light, such as blue light, red light, or green light. However, the material of the active layer 150 can be changed within the technical scope of the embodiment.

A first conductive clad layer can be formed between the first conductive semiconductor layer 140 and the active layer 150. If the first conductive semiconductor layer 140 is the N type semiconductor layer, the first conductive clad layer comprises an N type AlGaN layer, but the embodiment is not limited thereto.

The second conductive semiconductor layer 160 comprises semiconductor material doped with second conductive dopant. The second conductive semiconductor layer 160 has a single layer structure or a multi-layer structure and serves as a second electrode contact layer. If the second conductive semiconductor layer 160 is the P type semiconductor layer, the second conductive semiconductor layer 160 may comprise compound semiconductor comprising one selected from the group consisting of GaN, InN, AlN, InGaN, AlGaN, InAlGaN, and AlInN. If the second conductive dopant is P type dopant, at least one of Mg, Zn, Ca, Sr, and Ba can be added to the second conductive dopant.

A third conductive type semiconductor layer (not shown) is formed on the second conductive semiconductor layer 160.

The third conductive semiconductor layer may comprise semiconductor material doped with first conductive dopant, such as compound semiconductor material comprising one selected from the group consisting of GaN, InN, AlN, InGaN, AlGaN, InAlGaN, and AlInN.

A light emitting structure 165 comprises the first conductive semiconductor layer 140, the active layer 150, and the second conductive semiconductor layer 160. The light emitting structure 165 may further comprise the third conductive semiconductor layer. The first conductive semiconductor layer 140 may serve as a P type semiconductor layer, and the second conductive semiconductor layer 160 may serve as an N type semiconductor layer. Therefore, the light emitting structure 165 may have one of an N—P junction structure, a P—N junction structure, an N—P—N junction structure, and a P—N—P junction structure.

The second electrode layer 170 may be formed on the second conductive semiconductor layer 160 or the third conductive semiconductor layer. The second electrode layer 170 may comprise a transparent layer that allows incident light to pass therethrough. For instance, the second electrode layer 170 may comprise at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), ZnO, RuOx, TiOx, IrOx, and $SnO_2$, but the embodiment is not limited thereto.

In addition, the second electrode layer 170 may comprise a reflective electrode layer that reflects incident light. For instance, the second electrode layer 170 may comprise one selected from the group consisting of Al, Ag, Pd, Rh, Pt, and Ir, which can reflect the light when a flip chip scheme is employed. The second electrode layer 170 can be omitted. In this case, the second electrode pad 183 is formed on the second conductive semiconductor layer 160.

Referring to FIGS. 1 and 2, the second electrode pad 183 is formed on the second electrode layer 170.

The second electrode pad 183 directly or indirectly makes contact with the second electrode layer 170 and/or the second conductive semiconductor layer 160.

Figure 22:
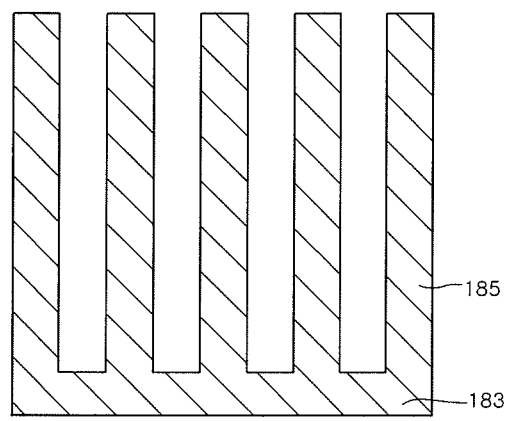
FIG. 22 is a top view of a second electrode of the semiconductor light emitting device.

A second electrode 185 branching from the second electrode pad 183, as seen in FIG. 22, may be formed on the second electrode layer 170. The second electrode 185 may have various pattern shapes, such as a linear pattern, a curve pattern, a linear-curve pattern, a branch pattern branching from one pattern, a polygonal pattern, a lattice pattern, a dot pattern, a lozenge pattern, a parallelogrammic pattern, a mesh pattern, a stripe pattern, a cross pattern, a radial pattern, a circular pattern, and a mixed pattern thereof However, the shape and the number of the patterns can be variously embodied in the embodiment without limitation. The second electrode 185 having the above pattern can uniformly supply power to the second conductive semiconductor layer 160, so that current may not be concentrated on one spot.

At least one second electrode pad 183 is provided. The second electrode pad 183 may comprise at least one selected from the group consisting of Ag, Ag alloy, Ni, Al, Al alloy, Rh, Pd, Ir, Ru, Mg, Zn, Pt, Au, Hf, and a combination thereof. The first electrode pad 183 and/or the second electrode (not shown) may serve as a second electrode unit that supplies power to the second conductive semiconductor layer 160. In addition, the second electrode unit may comprise the second electrode layer 170.

According to the first embodiment, the first electrode 130 is positioned between the substrate 110 and the first conductive semiconductor layer 140, and the second electrode unit is opposite to the first electrode 130. Further, the pattern of the first electrode 130 can be aligned under the active layer 150 without reducing the light emitting area. Thus, the power can be uniformly supplied over the whole area of the active layer of the semiconductor light emitting device 100, thereby improving light efficiency.

FIGS. 5 to 11 are sectional views showing the manufacturing process for the semiconductor light emitting device according to the first embodiment.

Figure 5:
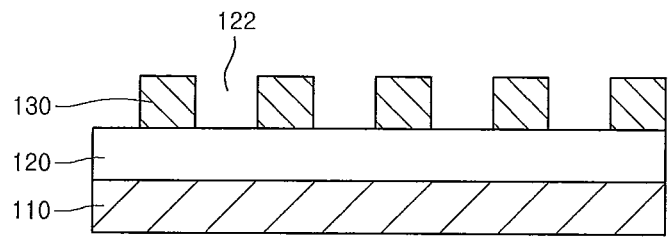
FIGS. 5 to 11 are sectional views showing the manufacturing process for the semiconductor light emitting device according to the first embodiment.

Referring to FIG. 5, the nitride semiconductor layer 120 is formed on the substrate 110.

The substrate 110 may comprise one selected from the group consisting of sapphire ($Al_2O_3$), SiC, Si, GaAs, GaN, ZnO, GaP, InP, and Ge. A concave-convex pattern can be formed on a predetermined area of the substrate 110.

A semiconductor is grown from the substrate 110 through E-beam deposition, PVD (physical vapor deposition), CVD (chemical vapor deposition), PLD (plasma laser deposition), dual-type thermal evaporation, sputtering, or MOCVD (metal organic chemical vapor deposition), but the embodiment is not limited thereto. The semiconductor comprises compound semiconductor material that satisfies the compositional formula of $In_xAl_yGa_{1-x-y}N$ ($0 \leq x \leq 1$, $0 \leq y \leq 1$, and $0 \leq x+y \leq 1$). Such a semiconductor material can be changed within the technical scope of the embodiment.

The nitride semiconductor layer 120 may comprise a buffer layer and/or an undoped semiconductor layer (not shown). The buffer layer relieves a lattice mismatching between GaN material and substrate material, and comprises at least one selected from the group consisting of GaN, InN, AlN, InGaN, AlGaN, InAlGaN and AlInN. The undoped semiconductor layer can be formed on the substrate 110 or the buffer layer and may comprise an undoped GaN-based semiconductor, In addition, the nitride semiconductor layer 120 may comprise semiconductor material doped with first conductive dopant.

Figure 6:
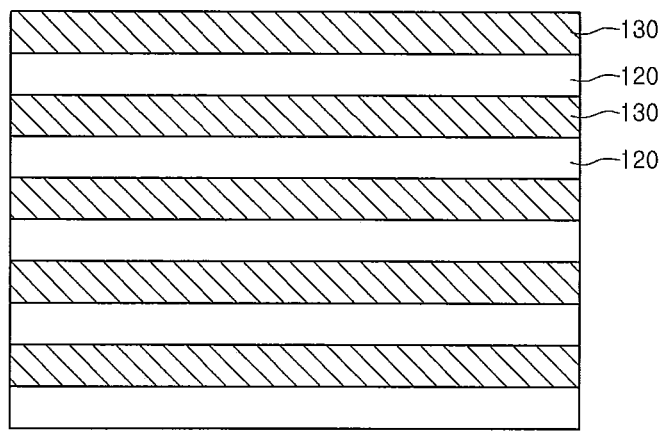

Referring to FIGS. 5 and 6, a plurality of first electrodes 130 are formed on the nitride semiconductor layer 120 while being spaced apart from each other. The first electrodes 130 are aligned in the form of a stripe pattern and the nitride semiconductor layer 120 is exposed through gaps 122 formed among the first electrodes 130. The semiconductor is grown from the exposed portion of the nitride semiconductor layer 120.

An additional electrode pattern can be provided to connect the first electrodes 130 one another, but the embodiment is not limited thereto. The first electrodes 130 may have various pattern shapes, such as a linear pattern, a curve pattern, a linear-curve pattern, a branch pattern branching from one pattern, a polygonal pattern, a lattice pattern, a dot pattern, a lozenge pattern, a parallelogrammic pattern, a mesh pattern, a stripe pattern, a cross pattern, a radial pattern, a circular pattern, and a mixed pattern thereof. The shape and the number of the patterns can be variously embodied in the embodiment without limitation.

Figure 7:
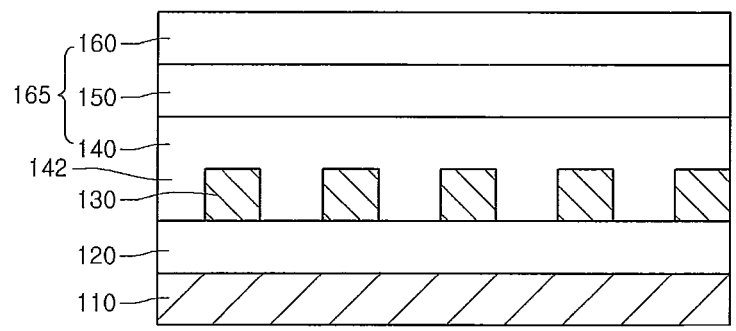

Referring to FIG. 7, the first conductive semiconductor layer 140, the active layer 150 and the second conductive semiconductor layer 160 are sequentially formed on the nitride semiconductor layer 120 and the first electrode 130.

The first conductive semiconductor layer 140 comprises semiconductor material doped with first conductive dopant. The first conductive semiconductor layer 140 has a single layer structure or a multi-layer structure and comprises a first electrode contact layer. If the first conductive semiconductor layer 140 is the N type semiconductor layer, the first conductive semiconductor layer 140 may comprise one selected from the group consisting of GaN, InN, AlN, InGaN, AlGaN, InAlGaN, and AlInN. If the first conductive dopant is N type dopant, the first conductive dopant may selectively comprise Si, Ge, Sn, Se or Te.

The lower portion 142 of the first conductive semiconductor layer 140 is grown from the top surface of the nitride semiconductor layer 120 corresponding to the gaps formed among the first electrodes 130. As the growing time goes by, the lower portion 142 of the first conductive semiconductor layer 140 extends toward top surfaces of the first electrodes 130. The first electrodes 130 can be electrically connected to a lower part of the first conductive semiconductor layer 140.

The lower portion 142 of the first conductive semiconductor layer 140 may be formed other semiconductor material, such as an undoped semiconductor layer and/or a buffer layer, but the embodiment is not limited thereto.

In addition, the undoped semiconductor layer can be formed between the first conductive semiconductor layer 140 and the first electrode 130. In this case, the thickness of the undoped semiconductor layer may vary depending on the resistance range thereof.

The active layer 150 is formed on the first conductive semiconductor layer 140. The active layer 150 is configured to have a single quantum well structure or a multiple quantum well (MQW) structure by using groups III-V compound semiconductor materials. For instance, the active layer 150 has a structure comprising InGaN well/GaN barrier layers. The active layer 150 comprises material having a band gap energy corresponding to the wavelength of light emitted through the active layer 150. For instance, the active layer 150 selectively comprises material that emits color light, such as blue light, red light, or green light. However, the material of the active layer 150 can be changed within the technical scope of the embodiment.

A first conductive clad layer can be formed between the first conductive semiconductor layer 140 and the active layer 150. If the first conductive semiconductor layer 140 is the N type semiconductor layer, the first conductive clad layer comprises an N type AlGaN layer, but the embodiment is not limited thereto.

The second conductive semiconductor layer 160 comprises at least one semiconductor layer doped with second conductive dopant and serves as the second electrode contact layer. If the second conductive semiconductor layer 160 is the P type semiconductor layer, the second conductive semiconductor layer 160 may comprise compound semiconductor comprising one selected from the group consisting of GaN, InN, AlN, InGaN, AlGaN, InAlGaN, and AlInN. If the second conductive dopant is P type dopant, at least one of Mg, Zn, Ca, Sr, and Ba can be added to the second conductive dopant.

The third conductive type semiconductor layer (not shown) is formed on the second conductive semiconductor layer 160. The third conductive semiconductor layer may comprise semiconductor material doped with first conductive dopant, such as compound semiconductor material comprising one selected from the group consisting of GaN, InN, AlN, InGaN, AlGaN, InAlGaN, and AlInN. If the third conductive semiconductor layer is the N type semiconductor layer, the third conductive semiconductor layer comprises at least one selected from the group consisting of GaN, InN, AlN, InGaN, AlGaN, InAlGaN, and AlInN. In addition, if the first conductive dopant is the N type dopant, the first conductive dopant selectively comprises Si, Ge, Sn, Se or Te.

The light emitting structure 165 comprises the first conductive semiconductor layer 140, the active layer 150, and the second conductive semiconductor layer 160. The light emitting structure 165 may further comprise the third conductive semiconductor layer. The first conductive semiconductor layer 140 may serve as a P type semiconductor layer, and the second conductive semiconductor layer 160 may serve as an N type semiconductor layer. Therefore, the light emitting structure 165 may have one of an N—P junction structure, a P—N junction structure, an N—P—N junction structure, and a P—N—P junction structure.

Figure 8:
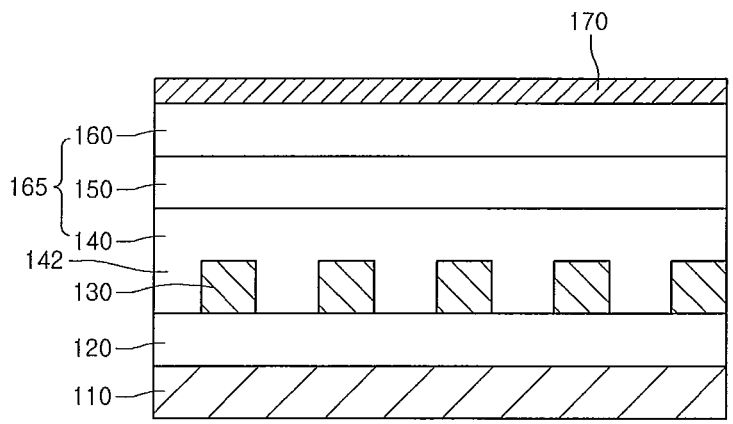

Referring to FIG. 8, the second electrode layer 170 may be formed on the second conductive semiconductor layer 160 or the third conductive semiconductor layer. The second electrode layer 170 may comprise a transparent layer that allows incident light to pass therethrough. For instance, the second electrode layer 170 may comprise at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), ZnO, RuOx, TiOx, IrOx, and $SnO_2$, but the embodiment is not limited thereto.

In addition, the second electrode layer 170 may comprise a reflective electrode layer that reflects incident light. For instance, the second electrode layer 170 may comprise one selected from the group consisting of Al, Ag, Pd, Rh, Pt, and Ir, which can reflect the light when a flip chip scheme is employed. In addition, the second electrode layer 170 can be omitted.

Figure 9:
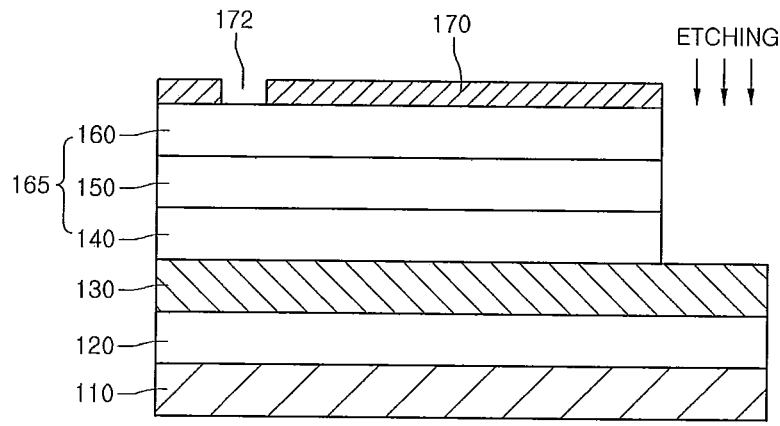

FIG. 9 is a view showing the mesa etching process, which represents another aspect of FIG. 8.

Referring to FIGS. 8 and 9, an opening 172 of the second electrode layer 170 can be formed by using a mask pattern when the second electrode layer 170 is formed, or the opening 172 can be formed by performing an etching process after the second electrode layer 170 has been formed.

The lower portion of the first conductive semiconductor layer 140 and a part of the pattern of the first electrode 130 can be exposed through the mesa etching process. The mesa etching process may comprise dry etching and/or wet etching. The second electrode 170 can be formed in the mesa etching area or not, but the embodiment is not limited thereto.

Figure 10:
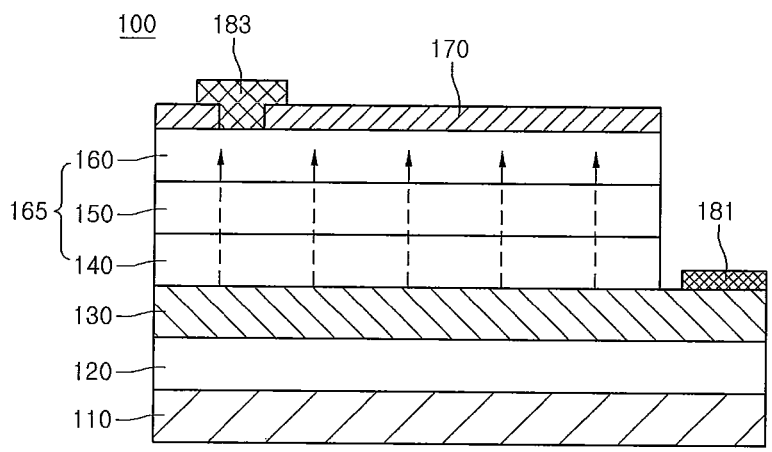
Figure 11:
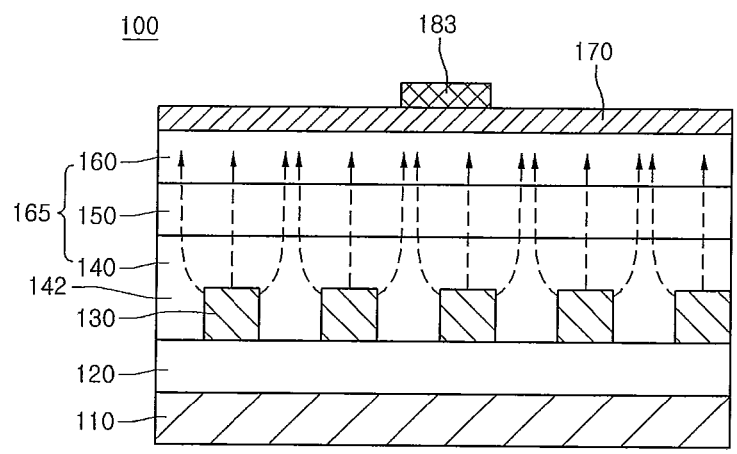

Referring to FIGS. 10 and 11, the first electrode pad 181 is formed on the first electrode 130, and the second electrode pad 183 or the second electrode (not shown) having a predetermined pattern comprising the second electrode pad can be formed on the second electrode layer 170.

The first electrode pad 181 can be formed on a part of the pattern of the first electrode 130, or on the first electrode 130 and the lower portion 142 of the first conductive semiconductor layer 140. The first electrode pad 181 comprises first electrode material, but the embodiment is not limited thereto.

The second electrode pad 183 is formed through the opening of the second electrode layer 170, and electrically makes contact with the second electrode layer 170 and the second conductive semiconductor layer 160. The second electrode pad 183, the second electrode, and the second electrode layer 170 may serve as the second electrode unit that supplies power to the second conductive semiconductor layer 160.

The second electrode may have various pattern shapes, such as a linear pattern, at least one curve pattern, a linear-curve pattern, a branch pattern branching from one pattern, a polygonal pattern, a lattice pattern, a dot pattern, a lozenge pattern, a parallelogrammic pattern, a mesh pattern, a stripe pattern, a cross pattern, a radial pattern, a circular pattern, and a mixed pattern thereof. However, the shape and the number of the patterns may be variously embodied in the embodiment without limitation.

At least one first electrode pad 181 and at least one second electrode pad 183 can be provided corresponding to the chip size. The number of the first electrode pad 181 and the second electrode pad 183 can be variously embodied in the embodiment without limitation.

The first electrode 130 may be formed between the substrate 110 and the first conductive semiconductor layer 140, and the second electrode unit is opposite to the first electrode 130. Further, the pattern of the first electrode 130 can be aligned under the active layer 150 without reducing the light emitting area.

In the semiconductor light emitting device 100, power having first polarity is supplied to the first electrode pad 181 and power having second polarity is supplied to the second electrode pad 183. The power having the first polarity can be uniformly supplied to the active layer 150 due to the first electrode 130. In addition, the power having the second polarity can be uniformly supplied to the active layer 150 due to the second electrode layer 170. If the second electrode is branched into a predetermined pattern, the power having the second polarity can be uniformly distributed.

Therefore, the power can be uniformly supplied over the whole area of the active layer 150 of the semiconductor light emitting device 100, so that light efficiency can be improved.

FIGS. 12 to 16 are sectional views showing various examples of the first electrode according to the first embodiment.

Figure 12:
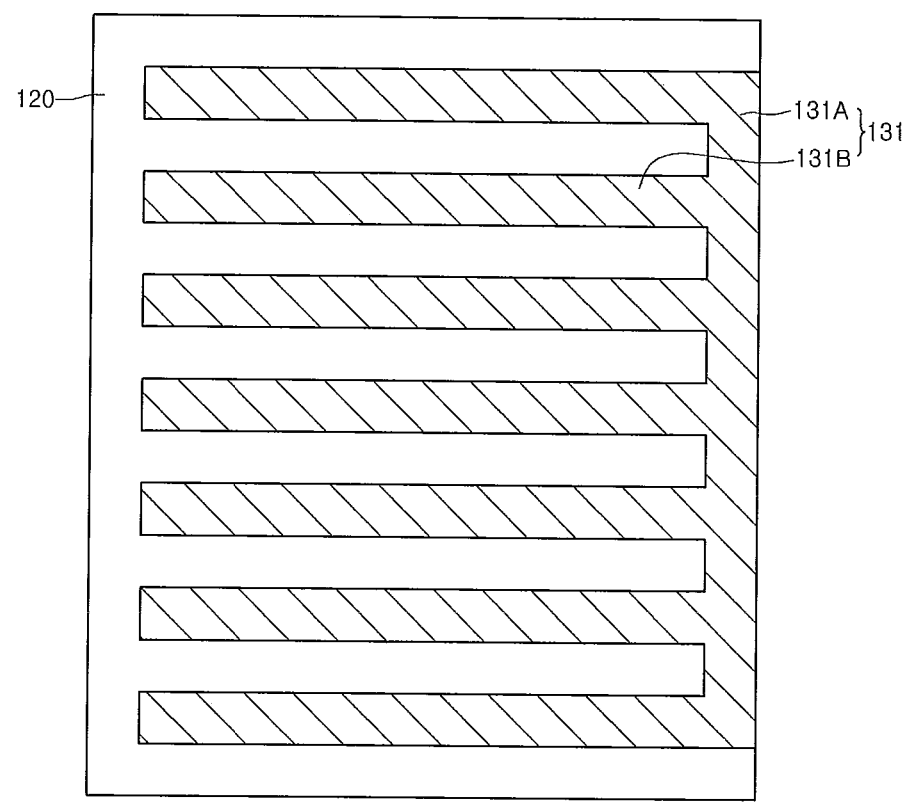
FIGS. 12 to 16 are sectional views showing examples of a pattern of a first electrode according to the first embodiment.

Referring to FIG. 12, a first electrode 131 can be formed on the nitride semiconductor layer 120 or can be embedded in the nitride semiconductor layer 120. The first electrode 131 comprises a body part 131A and branch parts 131B, in which the branch parts 131B branch from the body part 131A while being spaced apart from each other in the form of a multi-pronged spear.

The nitride semiconductor layer 120 can be formed corresponding to gaps formed among the branch parts 131B of the first electrode 131. In this case, the first electrode 131 is primarily formed and then the nitride semiconductor layer 120 is formed at a predetermined thickness. In addition, the first electrode 131 can be embedded in the nitride semiconductor layer 120. That is, the nitride semiconductor layer 120 is primarily formed except for the area for the first electrode 131, and then the first electrode 131 is embedded in the area formed in the nitride semiconductor layer 120. In this case, the first electrode 131 and the nitride semiconductor layer 120 can be aligned on the substrate.

Figure 13:
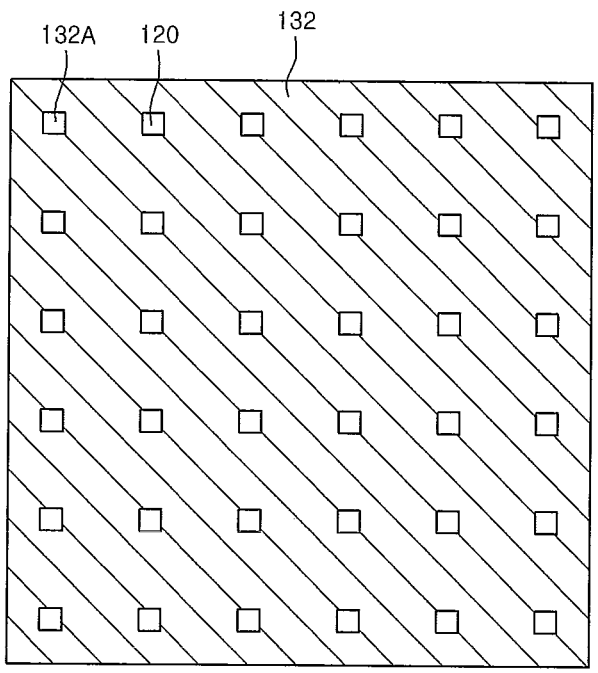

Referring to FIG. 13, a first electrode 132 has a plurality of openings 132A aligned in the mesh shape. Other semiconductors can be grown through the openings 132A.

Each opening 132A of the first electrode 132 may have a circular shape or a polygonal shape, but the embodiment is not limited thereto.

The nitride semiconductor layer 120 can be formed under the first electrode 132. In addition, the nitride semiconductor layer 120 can be re-grown through the opening 132A of the first electrode 132 and can be formed on the surface of the first electrode 132.

Figure 14:
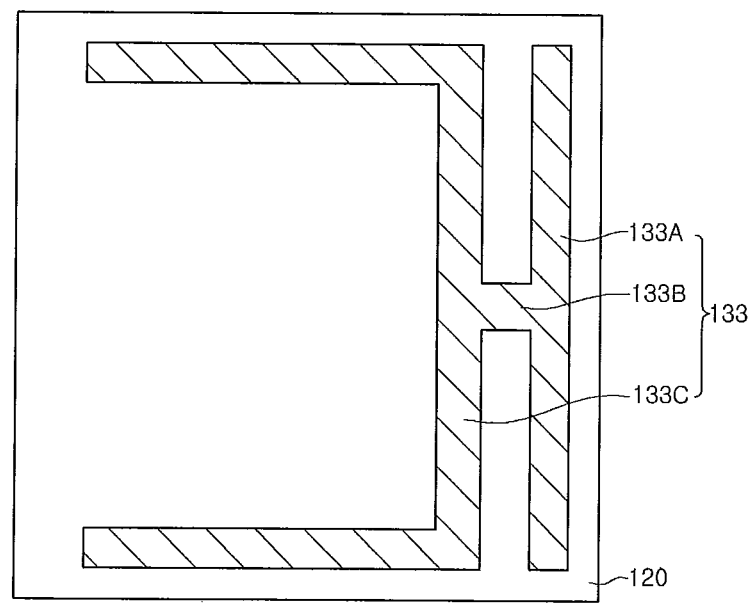

Referring to FIG. 14, a first electrode 133 is prepared in the form of a pattern, in which an intermediate electrode 133B is interposed between an electrode 133A having a linear shape and an electrode 133C having a two-pronged spear shape.

The electrode 133A having the linear shape is disposed at one side of the first electrode 133, the electrode 133C having the two-pronged spear shape has branched ends, and the intermediate electrode 133B interconnects the two electrodes 133A and 133C.

Figure 15:
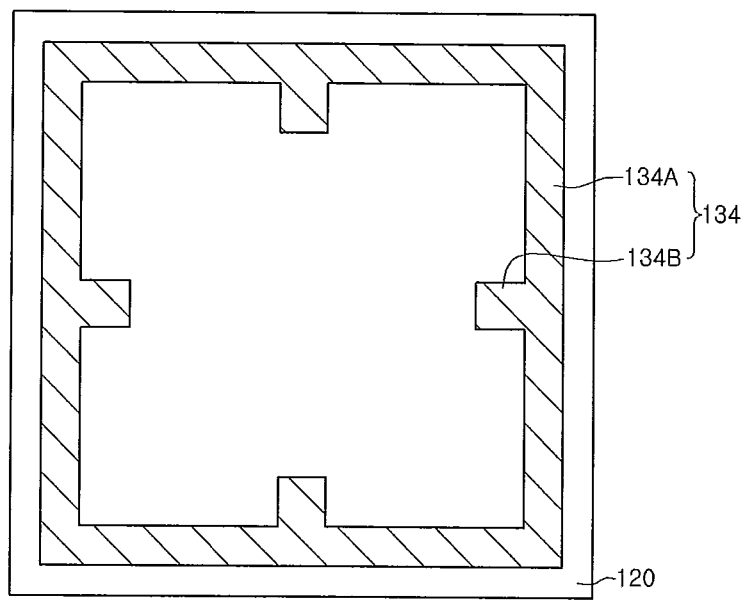

Referring to FIG. 15, a first electrode 134 comprises an electrode 134A having a polygonal shape, which is arranged along a chip edge, and electrodes 134B branching from centers of lateral sides of the electrode 134A having the polygonal shape.

Figure 16:
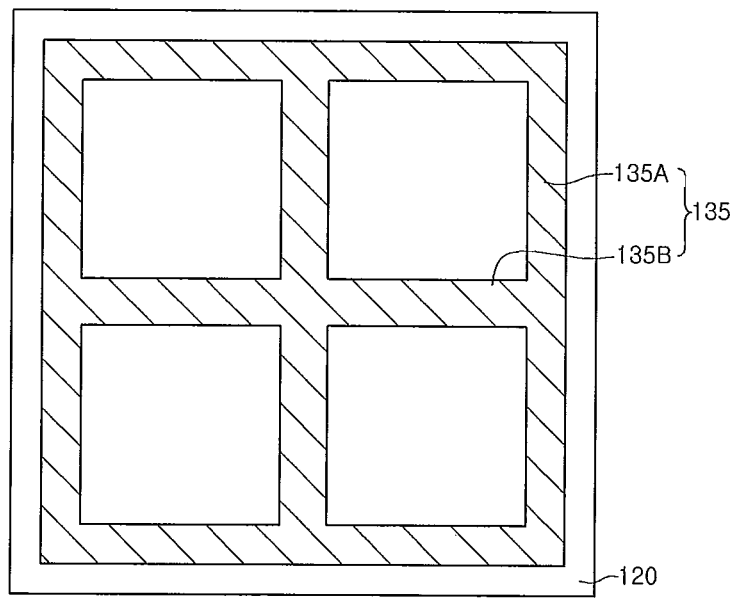

Referring to FIG. 16, a first electrode 135 comprises an electrode 135A having a polygonal shape, which is arranged along a chip edge, and electrodes 135B aligned in the electrode 135A in the form of a cross.

As shown in FIGS. 12 to 16, the pattern shape and the number of branch electrodes of the first electrodes 132 to 135 can be variously embodied within the technical scope of the embodiment.

Figure 17:
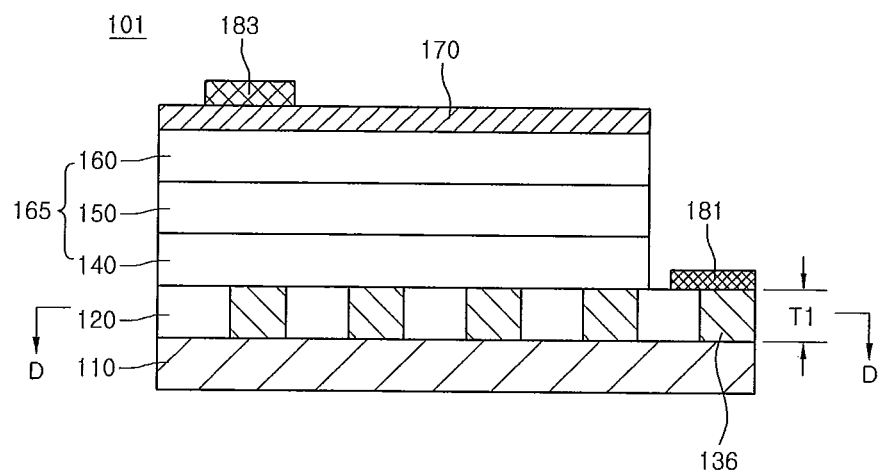
FIG. 17 is a side sectional view showing a semiconductor light emitting device according to the second embodiment.
Figure 18:
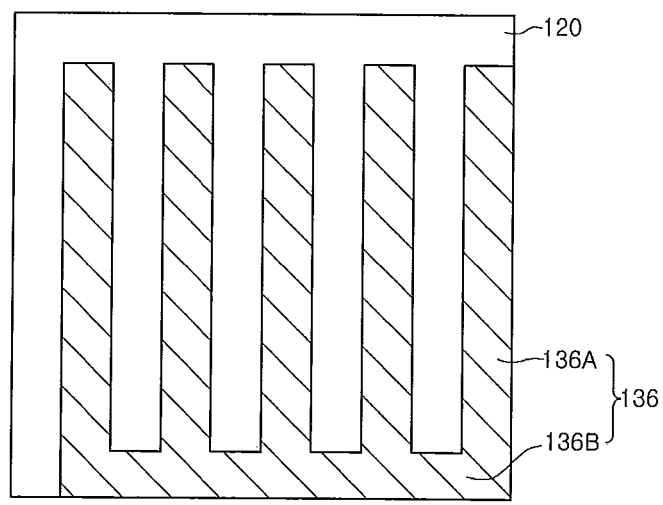
FIG. 18 is a side sectional view taken along line D-D of FIG. 17.

FIG. 17 is a side sectional view showing a semiconductor light emitting device according to the second embodiment, and FIG. 18 is a side sectional view taken along line D-D of FIG. 17. The second embodiment will be described with reference to the first embodiment and the same parts will be omitted in order to avoid redundancy.

Referring to FIG. 17, a semiconductor light emitting device 101 comprises a substrate 110, a nitride semiconductor layer 120, a first electrode 136, a first conductive semiconductor layer 140, an active layer 150, a second conductive semiconductor layer 160, a second electrode layer 170, a first electrode pad 181, and a second electrode pad 183.

The first electrode 136 and the nitride semiconductor layer 120 are formed on the substrate 110. As shown in FIG. 18, the first electrode 136 is prepared in the form of a pattern comprising a body part 136B and branch parts 136A having a multi-pronged spear shape. The first electrode 136 is formed on the substrate 110 and the nitride semiconductor layer 120 is formed corresponding to gaps formed among the branch parts 136A of the first electrode 136. The nitride semiconductor layer 120 may comprise at least one of a buffer layer, an undoped semiconductor layer and a semiconductor layer doped with first conductive dopant.

The sequence of forming the first electrode 136 and the nitride semiconductor layer 120 can be changed within the technical scope of the embodiment. The thickness T1 of the nitride semiconductor layer 120 is equal to or different from the thickness of the first electrode 136, and the embodiment is not limited thereto. The pattern shape of the first electrode 136 can be selected from the pattern shapes disclosed in the first embodiment.

The first conductive semiconductor layer 140 can be formed on the first electrode 136 and the nitride semiconductor layer 120 or an undoped semiconductor layer (not shown) can be formed on the first electrode 136 and the nitride semiconductor layer 120 at a predetermined thickness (for example, 5 μor less).

The first electrode pad 181 can be formed on the first electrode 136, or can be formed on the first electrode 136 and the nitride semiconductor layer 120.

Figure 19:
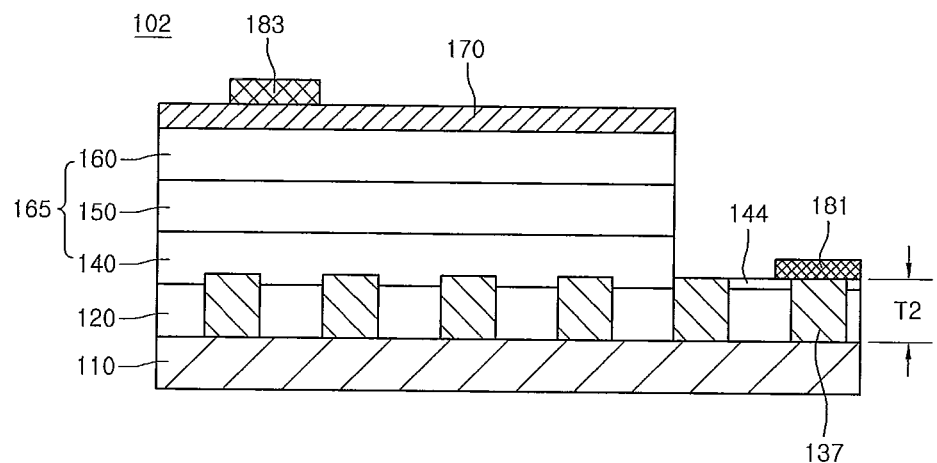
FIG. 19 is a side sectional view showing a semiconductor light emitting device according to the third embodiment.

FIG. 19 is a side sectional view showing a semiconductor light emitting device according to the third embodiment. The third embodiment will be described with reference to the first embodiment and the same parts will be omitted in order to avoid redundancy.

Referring to FIG. 19, a semiconductor light emitting device 102 comprises a substrate 110, a nitride semiconductor layer 120, a first electrode 137, a first conductive semiconductor layer 140, an active layer 150, a second conductive semiconductor layer 160, a second electrode layer 170, a first electrode pad 181, and a second electrode pad 183.

The first electrode 137 and the nitride semiconductor layer 120 are formed on the substrate 110. The first electrode 137 is prepared in the form of a pattern having a multi-pronged spear shape. The first electrode 137 is formed on the substrate 110 and the nitride semiconductor layer 120 is formed corresponding to gaps formed among branch parts of the first electrode 137.

The nitride semiconductor layer 120 may comprise at least one of a buffer layer, an undoped semiconductor layer and a semiconductor layer doped with first conductive dopant.

The sequence of forming the first electrode 137 and the nitride semiconductor layer 120 can be changed within the technical scope of the embodiment. The thickness T2 of the first electrode 137 is larger that the thickness of the nitride semiconductor layer 120. In this case, the contact area between the first electrode 137 and the first conductive semiconductor layer 140 can be increased as compared with that of the first embodiment. The pattern shape of the first electrode 137 can be selected from the pattern shapes disclosed in the first embodiment.

The first conductive semiconductor layer 140 can be formed on the first electrode 137 and the nitride semiconductor layer 120 or an undoped semiconductor layer (not shown) can be formed on the first electrode 137 and the nitride semiconductor layer 120 at a predetermined thickness (for example, 5 µm or less).

The first electrode pad 181 can be formed on the first electrode 137, or can be formed on the first electrode 137 and the nitride semiconductor layer 120. The first electrode pad 181 is disposed on a portion 144 of the first conductive layer 140.

Figure 20:
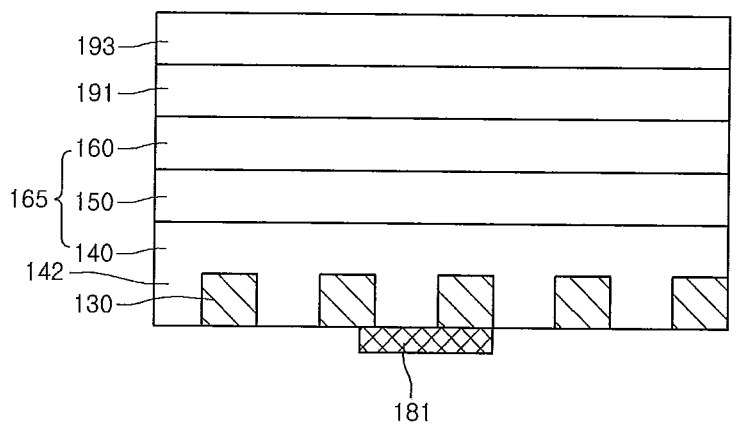
FIG. 20 is a side sectional view showing a semiconductor light emitting device according to the fourth embodiment.

FIG. 20 is a side sectional view showing a semiconductor light emitting device according to the fourth embodiment. The fourth embodiment will be described with reference to the first embodiment and the same parts will be omitted in order to avoid redundancy.

Referring to FIG. 20, a semiconductor light emitting device 103 comprises a first electrode 130, a first conductive semiconductor layer 140, an active layer 150, a second conductive semiconductor layer 160, a second electrode layer 191, a conductive support member 193 and a second electrode pad 181.

The second electrode layer 191 is formed on the second conductive semiconductor layer 160 and may comprise at least one selected from the group consisting of Ag, Ni, Al, Rh, Pd, Ir, Ru, Mg, Zn, Pt, Au, Hf, and a combination thereof. An ohmic contact layer (not shown) comprising a plurality of patterns can be formed between the second electrode layer 191 and the second conductive semiconductor layer 160. The ohmic contact layer may comprise at least one selected from the group consisting of ITO (Indium Tin Oxide), IZO (Indium zinc oxide), AZO (Aluminum Zinc Oxide), IZTO (indium zinc tin oxide), IAZO (indium aluminum zinc oxide), IGZO (indium gallium zinc oxide), IGTO (indium gallium tin oxide), and ATO (antimony tin oxide).

The second electrode layer 191 may serve as an electrode that stably supplies power having second polarity to the light emitting structure. The second electrode layer 191 makes contact with the second conductive semiconductor layer 160 through schottky contact or ohmic contact. If the ohmic contact layer exists, since electric resistance of the ohmic contact layer is different from that of the second electrode layer 191, the current supplied to the second conductive layer 160 can be dispersed.

The conductive support member 193 may comprise copper, gold, nickel, molybdenum, copper-tungsten, or a carrier wafer (for example, Si, Ge, GaAs, ZnO, SiC, and the like). For instance, the second electrode layer 191 can be formed through a sputtering process, and the conductive support member 193 can be formed through a plating process or a bonding process. However, such processes can be changed within the technical scope of the embodiment.

Then, the substrate 110 (see, FIG. 3) aligned under the first conductive semiconductor layer 140 is removed. At this time, the substrate 110 is directed upward and the physical and/or chemical process is performed to remove the substrate 110. The physical process comprises an LLO (Laser Lift Off) scheme, in which laser having a predetermined wavelength is irradiated onto the substrate, and the chemical process comprises an etching scheme, in which an etching solution is used to remove the nitride semiconductor layer formed on the substrate.

In addition, the nitride semiconductor layer 120 (see, FIG. 3), which is formed under the first conductive semiconductor layer 140 and the first electrode 130, is removed through a wet etching scheme or a polishing scheme. If the nitride semiconductor layer 120 comprises the first conductive semiconductor layer 120 may not be removed.

As the substrate and the undoped semiconductor layer have been removed, bottoms of the first conductive semiconductor layer 140 and the first electrode 130 are exposed. Thus, the ICP/RCE (Inductively coupled Plasma/Reactive Ion Etching) process is performed with respect to the bottom of the chip.

The first electrode pad 181 is formed under the first conductive semiconductor layer 140. The first electrode pad 181 is positioned under the first electrode 130, or under the first electrode 130 and the lower portion 142 of the first conductive semiconductor layer 140.

Figure 21:
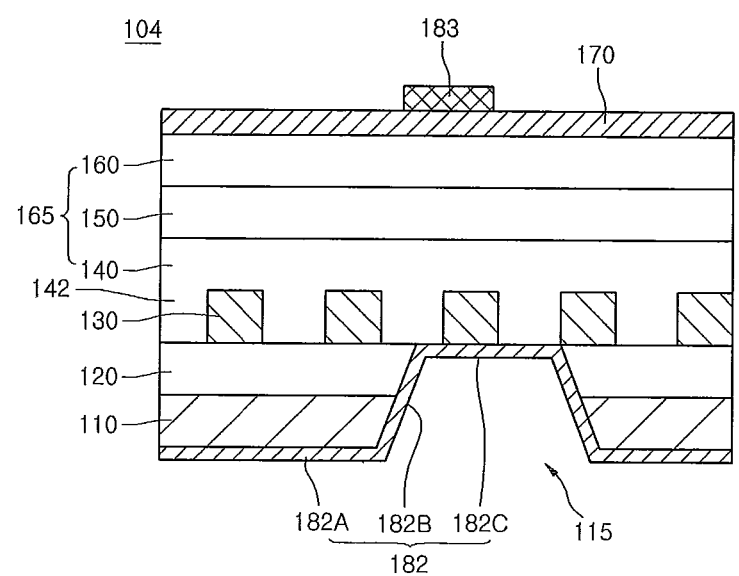
FIG. 21 is a side sectional view showing a semiconductor light emitting device according to the fifth embodiment.

FIG. 21 is a side sectional view showing a semiconductor light emitting device according to the fifth embodiment. The fifth embodiment will be described with reference to the first embodiment and the same parts will be omitted in order to avoid redundancy.

Referring to FIG. 21, a semiconductor light emitting device 104 comprises a substrate 110, a nitride semiconductor layer 120, a first electrode 130, a first conductive semiconductor layer 140, an active layer 150, a second conductive semiconductor layer 160, a second electrode layer 170, a first electrode layer 182, and a second electrode pad 183.

A groove 115 is formed at the center area of the substrate 110 and the nitride semiconductor layer 120. Sidewalls of the groove 115 are inclined and the bottom of the first electrode 130 is exposed through the groove 115.

The first electrode layer 182 comprises an electrode contact part 182C making contact with the first electrode 130, an inclined part 182B aligned on the sidewalls of the groove 115, and a bottom part 182A aligned on the bottom of the substrate 110. The electrode contact part 182C electrically makes contact with the first electrode 130 and the lower potion 142 of the first conductive semiconductor layer 140.

The power having first polarity is provided to the bottom part 182A of the first electrode layer 182 and then supplied to the first electrode 130 through the inclined part 182B and the electrode contact part 182C of the first electrode layer 182.

The second electrode layer 170 may comprise a transparent electrode layer and the first electrode layer 182 may comprise a reflective electrode layer. The first electrode 130 and the first electrode layer 182 are defined as a first electrode unit.

The first electrode layer 182 can reflect light incident from the bottom of the chip. The first electrode layer 182 may comprise at least one selected from the group consisting of Ag, Ni, Al, Rh, Pd, Ir, Ru, Mg, Zn, Pt, Au, Hf, and a combination thereof. The inclined part 182B of the first electrode layer 182 can improve the orientation angle of incident light due to the inclined configuration thereof.

The embodiment can improve current efficiency and light efficiency. The embodiment can uniformly supply current by distributing the current through a first electrode positioned under an active layer in various shapes. The embodiment can improve current spreading and light reflective efficiency. The embodiment can improve ESD (electrostatic discharge). The embodiment can prevent a light emitting area of an active layer from being reduced.

In the description of the embodiment, it will be understood that when a layer (or film), a region, a pattern, or a structure is referred to as being "on" or "under" another substrate, another layer, another region, another pad, or another pattern, it can be directly on the other substrate, layer, region, pad or pattern, or intervening layers may also be present. In addition, the top and the bottom of each layer will be defined on the basis of the drawings.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The embodiment can provide the semiconductor light emitting device, such as the LED.

The embodiment can improve light efficiency and ESD of the semiconductor light emitting device.

What is claimed is:

1. A semiconductor light emitting device comprising:
   a first conductive semiconductor layer;
   an active layer on the first conductive semiconductor layer;
   a second conductive semiconductor layer on the active layer;
   a first electrode under the first conductive semiconductor layer, the first electrode comprising patterns having a predetermined shape;
   a nitride semiconductor layer between the patterns of the first electrode; and
   a first undoped semiconductor layer under the nitride semiconductor layer and the first electrode,
   wherein a top surface of the first electrode physically contacts a lower surface of the first conductive semiconductor layer,
   wherein a portion of the nitride semiconductor layer is disposed between side surfaces of the first electrode,
   wherein the first conductive semiconductor layer is disposed between the first electrode and the active layer,
   wherein the first electrode is disposed between the first undoped semiconductor layer and the first conductive semiconductor layer, and
   wherein the first electrode physically contacts the first undoped semiconductor layer and the first conductive semiconductor layer.

2. The semiconductor light emitting device as claimed in claim 1, wherein the nitride semiconductor layer comprises an undoped semiconductor layer.

3. The semiconductor light emitting device as claimed in claim 1, wherein the nitride semiconductor layer comprises a group III-V compound semiconductor layer doped with first conductive dopant.

4. The semiconductor light emitting device as claimed in claim 3, further comprising a substrate under the first undoped semiconductor layer, wherein the first undoped semiconductor layer is disposed between the substrate and the first electrode.

5. The semiconductor light emitting device as claimed in claim 1, comprising a first electrode pad electrically connected to a top of the patterns of the first electrode and disposed on a portion of the first electrode.

6. The semiconductor light emitting device as claimed in claim 1, wherein the first electrode comprises at least one of a linear pattern, a curve pattern, a linear-curve pattern, a branch pattern branching from one pattern, a polygonal pattern, a lattice pattern, a dot pattern, a lozenge pattern, a parallelogrammic pattern, a mesh pattern, a stripe pattern, a cross pattern, a radial pattern, a circular pattern, and a mixed pattern thereof.

7. A semiconductor light emitting device comprising:
   a light emitting structure comprising a plurality of compound semiconductor layers;
   a first electrode having a plurality of branches under the light emitting structure;
   a nitride semiconductor layer disposed between branches of the first electrode and under the light emitting structure;
   a substrate disposed under the first electrode and the nitride semiconductor layer;
   a first electrode pad electrically connected to the first electrode; and
   a second electrode on the light emitting structure, wherein the light emitting structure comprises:
   a first conductive semiconductor layer electrically connected to the first electrode;
   a second conductive semiconductor layer electrically connected to the second electrode; and
   an active layer between the first conductive semiconductor layer and the second conductive semiconductor layer,
   wherein the first conductive semiconductor layer is disposed between the first electrode and the active layer,
   wherein a top surface of the first electrode physically contacts a lower surface of the first conductive semiconductor layer,
   wherein the first electrode is disposed between the substrate and the first conductive semiconductor layer and physically contacts a top surface of the substrate and the first conductive semiconductor layer,
   wherein the nitride semiconductor layer physically contacts the top surface of the substrate and the first conductive semiconductor layer,
   wherein the nitride semiconductor layer comprises an undoped semiconductor layer disposed between the plurality of branches of the first electrode, and
   wherein the substrate includes an insulating material.

8. The semiconductor light emitting device as claimed in claim 7, wherein the nitride semiconductor layer comprises a group III-V compound semiconductor layer doped with first conductive dopant.

9. The semiconductor light emitting device as claimed in claim 8, wherein the second electrode has at least one branch, and the first and second electrodes comprise at least one of a linear pattern, a curve pattern, a linear-curve pattern, a branch pattern branching from one pattern, a polygonal pattern, a lattice pattern, a dot pattern, a lozenge pattern, a parallelogrammic pattern, a mesh pattern, a stripe pattern, a cross pattern, a radial pattern, a circular pattern, and a mixed pattern thereof.

10. The semiconductor light emitting device as claimed in claim 1, wherein the first electrode includes a transmissive material.

11. The semiconductor light emitting device as claimed in claim 1, wherein the first electrode has a work function of 3 eV or above.

12. The semiconductor light emitting device as claimed in claim 1, wherein the first electrode has a length equal to a width of a lower surface of the first conductive semiconductor layer.

13. The semiconductor light emitting device as claimed in claim 4,
wherein one of the side surfaces of the first electrode physically contacts an inner side of the nitride semiconductor layer, and
wherein the nitride semiconductor layer physically contacts the first conductive semiconductor layer and the first undoped semiconductor layer.

14. The semiconductor light emitting device as claimed in claim 13, further comprising a first electrode pad physically contacting the top surface of the first electrode and a top surface of the nitride semiconductor layer.

15. The semiconductor light emitting device as claimed in claim 1, wherein the nitride semiconductor layer has a thickness equal to that of the first electrode.

16. A semiconductor light emitting device comprising:
a light emitting structure comprising:
a first conductive semiconductor layer;
a second conductive semiconductor layer; and
an active layer between the first conductive semiconductor layer and the second conductive semiconductor layer;
a substrate under the first conductive semiconductor layer;
a first nitride semiconductor layer between the substrate and the first conductive semiconductor layer;
a first electrode having a plurality of branches between the substrate and the first conductive semiconductor layer;
a second nitride semiconductor layer between the substrate and the first nitride semiconductor layer; and
a second electrode contacted to the second conductive semiconductor layer,
wherein a top surface of the first electrode physically contacts a lower surface of the first conductive semiconductor layer,
wherein a side surface of the first electrode physically contacts an inner side of the first nitride semiconductor layer,
wherein a lower surface of the first electrode physically contacts an inner side of the second nitride semiconductor layer, and
wherein at least one of the first and second nitride semiconductor layers is formed as an undoped semiconductor layer.

17. The semiconductor light emitting device as claimed in claim 4, wherein the first conductive semiconductor layer includes an n-type semiconductor layer and the second conductive semiconductor layer includes a p-type semiconductor layer, and
wherein the first electrode includes a metallic material.

18. The semiconductor light emitting device as claimed in claim 7, wherein the first conductive semiconductor layer includes an n-type semiconductor layer and the second conductive semiconductor layer includes a p-type semiconductor layer, and
wherein the first electrode includes a metallic material.

* * * * *